(12) United States Patent
Sung et al.

(10) Patent No.: US 8,652,939 B2
(45) Date of Patent: Feb. 18, 2014

(54) METHOD AND APPARATUS FOR DIE ASSEMBLY

(75) Inventors: Ming-Chung Sung, Taichung (TW); Yu-Chih Liu, Taipei (TW); Wei-Ting Lin, Taipei (TW); Chien-Hsiun Lee, Chu-tung Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 262 days.

(21) Appl. No.: 13/276,184

(22) Filed: Oct. 18, 2011

(65) Prior Publication Data
US 2013/0093094 A1 Apr. 18, 2013

(51) Int. Cl.
*H01L 21/00* (2006.01)

(52) U.S. Cl.
USPC .................................................. 438/460

(58) Field of Classification Search
USPC .................................................. 438/460, 462
See application file for complete search history.

(56) References Cited

U.S. PATENT DOCUMENTS 8,524,537 B2 * 9/2013 Yun et al. .................... 438/114

OTHER PUBLICATIONS

Zhang, Z., et al. "Double-Layer No-Flow Underfill Process for Flip-Chip Applications," IEEE Transactions on Components and Packaging Technologies, vol. 26, No. 1, Mar. 2003, pp. 239-244.

Libres, J., et al., "Investigation of Bump Crack and Deformation on Pb-Free Flip Chip Packages," 2010 Proceedings 60th Electronic Components and Technology Conference (ECTC), 2010, pp. 1536-1540.

Paquet, M.-C., et al., "Underfill Delamination to Chip Sidewall in Advanced Flip Chip Packages," 59th Electronic Components and Technology Conference (ECTC), 2009, pp. 960-965.

Zhang, F., et al., "An Investigation Into the Effects of Flux Residues on Properties of Underfill Materials for Flip Chip Packages," IEEE Transactions on Components and Packaging Technologies, vol. 26, Issue 1, 2003, pp. 233-238.

* cited by examiner

*Primary Examiner* — Jenny L Wagner
(74) *Attorney, Agent, or Firm* — Slater & Matsil, L.L.P.

(57) ABSTRACT

Methods and apparatus for die assembly. A method includes forming a trench extending from an active surface of a semiconductor substrate comprising a plurality of integrated circuit dies having connector terminals extending from the active surface, the trench extending into, but not through, the semiconductor substrate; forming a protective layer overlying the active surface of the semiconductor substrate and the trench, and covering the lower portion of the connector terminals; opening a pre-dicing opening in the protective layer and within the trench; applying a tape over the active surface of the semiconductor wafer, the protective layer and the connector terminals; and performing an operation on a backside of the semiconductor substrate to remove material until the pre-dicing opening is exposed on the backside of the semiconductor wafer. An apparatus includes a semiconductor substrate with integrated circuits and a protective layer surrounding connector terminals of integrated circuits.

14 Claims, 7 Drawing Sheets

METHOD AND APPARATUS FOR DIE ASSEMBLY

BACKGROUND

A common requirement for semiconductor processing and advanced packaging of integrated circuit dies including 3D and through-via approaches is assembly of thin integrated circuit dies, or increasingly, ultra-thin integrated circuit dies, to a substrate to form a completed device. The thin integrated circuit dies may be formed as a portion of a semiconductor wafer manufactured including many such integrated circuit dies in a wafer level process ("WLP"). The integrated circuit dies typically include active and passive circuit devices, such as transistors and capacitors, fabricated in a semiconductor process. A plurality of connector terminals are formed on the active surface of the integrated circuit dies while they are still at the wafer level; these connector terminals are disposed on one surface, sometimes called the "active" or "front" surface, of the semiconductor wafer. The assembly of the dies to the substrates requires that the integrated circuit dies be separated from the wafer; each integrated circuit die is then mounted with the respective connector terminals forming electrical and physical connections to a substrate.

In the conventional die assembly process, several problems are encountered which can affect the reliability and yield of the finished devices, and thus increase cost and/or lower throughput. A backgrinding operation is performed to thin the wafer including the plurality of dies. Prior to the backgrinding operation, the connector terminals are formed and extend vertically away from the face of the semiconductor wafer, the connectors are also very small. These electrical connectors may be, for example, controlled collapse chip connectors ("C4"), copper or copper alloy pillars, columns, studs or bumps, or lead based and lead-free solder connectors, which may be formed as solder columns, balls, or solder bumps or micro-bumps. The connector terminals may be of a pillar, columnar, round or ovoid shape.

In some conventional methods, a backgrinding tape is applied over the semiconductor wafer covering the substrate and electrical connector terminals. The entire semiconductor wafer including the plurality of integrated circuit dies is then inverted using the backgrinding tape as support. A mechanical grinding operation is performed on the backside of the semiconductor wafer to thin the wafer to the desired thickness. The backgrinding tape is then released by performing a cure step. The tape is removed from the connector terminals, and the assembly continues by then separating the dies from the wafer, and mounting the connector terminals of the individual dies to a substrate.

Problems observed with the conventional assembly methods include a failure of the backgrinding tape to release from the connector terminals, leaving a residue which can lead to delamination of underfill materials in later process steps; unwanted flux residue around the electrical connectors terminals, causing electrical faults, and uneven wafer thinning due to uneven stress concentrations during the backgrinding process.

BRIEF DESCRIPTION OF THE FIGURES

For a more complete understanding of the present disclosure, and the advantages thereof, reference is now made to the following descriptions taken in conjunction with the accompanying drawings, in which.

The drawings, schematics and diagrams are illustrative and not intended to be limiting, but are examples of embodiments of the disclosure, are simplified for explanatory purposes, and are not drawn to scale.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present application, which are now described in detail, provide novel methods and apparatus for manufacturing semiconductor devices including providing a protective layer for connector terminals during various assembly steps for mounting dies such as flip chip integrated circuit devices to a substrate. These integrated circuit devices may include thin or even ultra-thin semiconductor wafer portions. Through-vias may be included in the integrated circuit devices, and wafer thinning may be performed to complete the through-vias. In alternative embodiments, wafer thinning may be used with no through-vias. Thin and ultra-thin die devices are particularly important for 3D packaging technologies that include die stacking, through-vias and multiple chip modules in a single packaged device.

Figure 1:
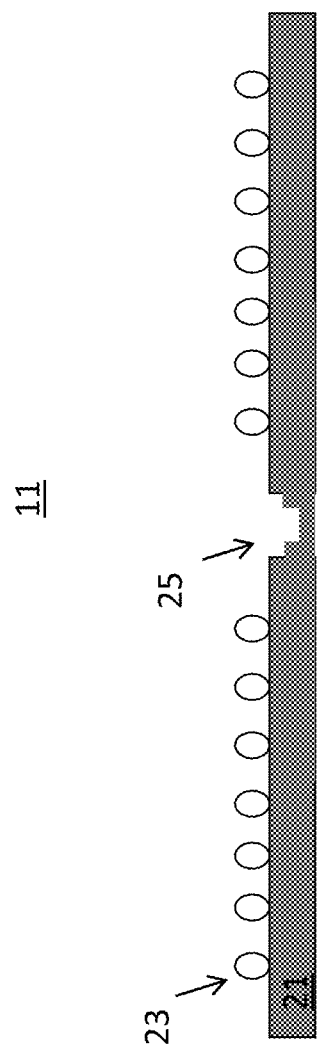
FIG. 1 depicts in a cross sectional view an embodiment semiconductor wafer at an intermediate embodiment process step.

FIG. 1 depicts in a cross sectional view an embodiment device 11 including semiconductor wafer 21. Semiconductor 21 includes a plurality of integrated circuits having connector terminals 23 on the active surface of the semiconductor wafer 21. The connector terminals 23 may be of various types. Controlled collapse chip connectors ("C4"), gold studs or pillars, copper pillars or columns, and/or solder pillars, balls or bumps may be used as alternative embodiments to from the connector terminals. These terminals form the external electrical connectors to the active and passive circuit devices fabricated on the semiconductor wafer 21.

In FIG. 1, trench 25 is formed between two of the integrated circuit devices and extends from the active surface. In FIG. 1 this is the top surface as shown, but the illustrated wafer orientation is arbitrary. The trench extends from the active surface of wafer 21 and into, but not through, the semiconductor wafer. Semiconductor wafer 21 may be of various thicknesses at this stage and may be, for example, several hundred microns thick. In an example, the wafer is approximately 750 ums thick, although this is not limiting and many different thicknesses may be used.

Connector terminals 23 are small, between 60-100 microns in diameter, and are also subject to damage during various process steps. These connectors 23 will be attached to electrical pads or lands on a substrate (not shown) when the die mounting assembly is completed, thereby making electrical connection to the system, and also providing physical connection to the substrate. The substrate may be a circuit board, of various compositions, or another semiconductor material, a film, or other material. In some applications the substrate is another integrated circuit and the integrated circuit devices may be stacked and electrically coupled together to form a system or advanced device.

Figure 2:
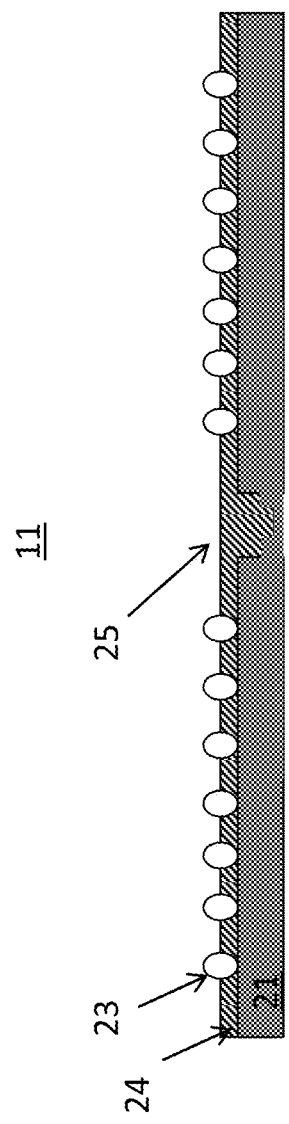
FIG. 2 depicts in a cross sectional view the embodiment semiconductor wafer of FIG. 1 following additional process steps.

FIG. 2 depicts in cross section the example device 11 following an additional process step. Between the views in FIG. 1 and FIG. 2, a protective layer 24 is formed and it covers the active surface of semiconductor wafer 21. The layer 24 also is thick enough to cover the lower portion of the connector terminals 23. This layer 24 may be between 10 and 80 microns thick, for example. In an example, which is not limiting, the layer is formed to cover approximately half of the connector terminals, the lower half in FIG. 2. As will be described in further detail below, the addition of this protective layer provides several advantages in later process steps and in the reliability of the completed devices.

Protective layer 24 provides electrical and physical protection and may be formed of a polyimide, for example. In alternative embodiments, underfill materials may be used for layer 24. The underfill materials are similar to those used to fill the space formed between the active surface of a flip chip device and the supporting substrate. These underfill materials may be formed of known materials including epoxies, resins, mold compounds, and epoxy resin mold compounds. In alternative embodiments, the underfill materials may include filler materials and additives. The use of thermally conductive fillers allows control of the coefficient of thermal expansion (CTEs) of the underfill material. Using various compositions, the underfill may be selected to reduce thermal stress during thermal cycles of the finished assembly. By reducing CTE mismatch between the semiconductor materials including the wafer, the connector terminals, the underfill layer, and the substrate, for example, thermal stress may be reduced during thermal cycles that will occur in the devices when in use.

Figure 3:
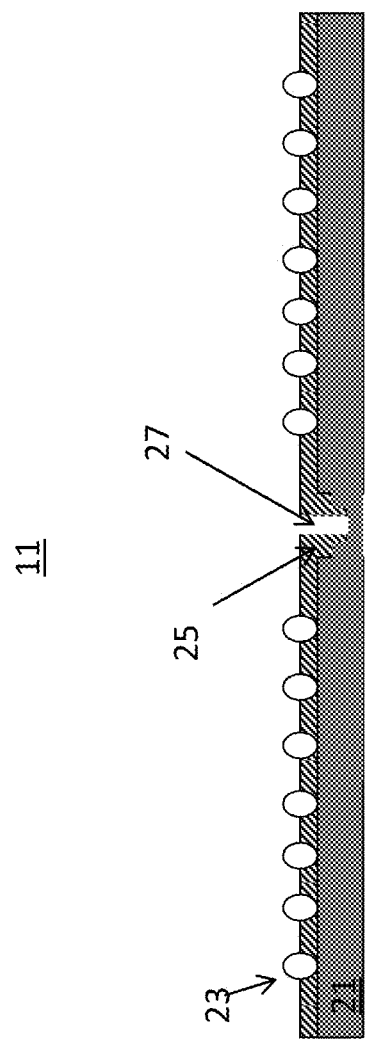
FIG. 3 depicts in a cross sectional view the embodiment semiconductor wafer of FIG. 2 following additional process steps.

FIG. 3 depicts the device 11 following additional processing. After the protective layer 24 is formed, a dicing saw or other method may be used to form a pre-dicing opening 27 in the protective layer 24 between the integrated circuit devices. In an embodiment, the pre-dicing opening 27 is generally centrally located within the trench 25. The pre-dicing opening 27 could be formed using mechanical sawing, etch technology, or laser dicing tools, as non-limiting examples. Importantly the pre-dicing opening 27 does not extend completely through the semiconductor wafer 21, but generally forms an opening extending towards or to the bottom of the trench 25. As will be shown in detail later, this pre-dicing opening 27 will become the area where the individual integrated circuit dies are separated one from another during the embodiment processes.

Figure 4:
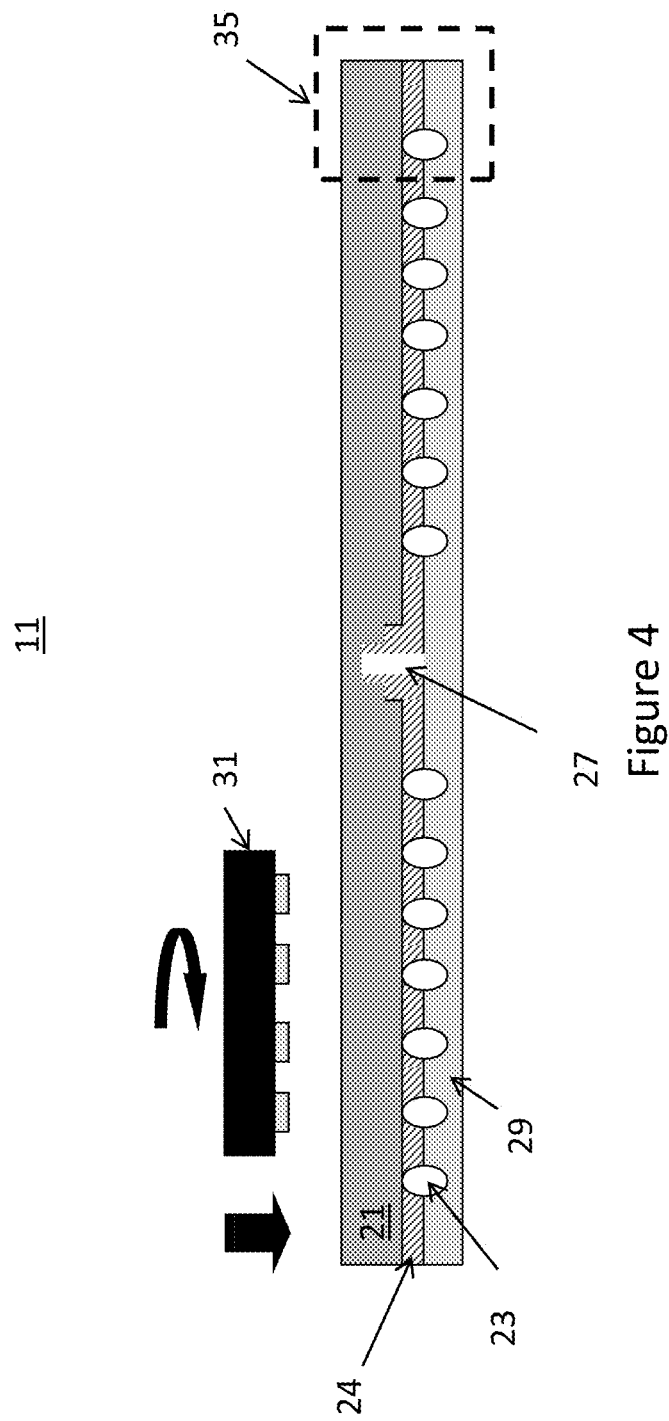
FIG. 4 depicts in a cross sectional view an embodiment semiconductor wafer in an additional processing step.

In FIG. 4, additional processing steps are shown performed on device 11, again depicted in a cross sectional view. Semiconductor wafer 21 has now been inverted, or "flipped", so that the backside surface is available for processing, and the active surface faces downward. Connector terminals 23 now extend downward as shown in this orientation, although again while the orientation shown is useful for illustration, it is arbitrary. Layer 24 is depicted on the active surface of semiconductor 21, and trench 27 is again shown between the integrated circuit dies and extending upwards, in this figure, but not through the wafer 21. Area 35 is highlighted and this area is shown in detail in FIG. 5, discussed below.

In FIG. 4 a tape such as a backgrinding tape 29 is applied over the active surface of the wafer 21, the connection terminals 23, and the protective layer 24. This tape supports the wafer 21 and the terminals 23 during the mechanical backgrinding process. The tape may be non-UV or UV releasable. UV releasable tape is removed after grinding by first curing using a UV light source, which breaks down a UV sensitive adhesive, and then removing the tape. Non-UV tape is removed mechanically without need for the UV cure. Both types of backgrinding tape may be used with the embodiments. Other tapes could also be used.

A backgrinding tool 31 is shown being positioned and movably configured over the wafer 21 to remove a portion of the semiconductor wafer 21 from the backside surface. This is done in a wafer thinning operation. The backgrinding tool 31 rotates and applies mechanical grinding tools to the surface of the wafer. After thinning the wafer 21 may become quite thin, less than 200 ums, for example, and in some examples, as little as 50-200 ums after the thinning operation. In one embodiment the wafer 21 is thinned by mechanical grinding as illustrated in FIG. 4. In alternative embodiments, the mechanical grinding may be followed by, or combined with, chemical mechanical polishing ("CMP") or chemical etch steps to polish the surface and/or to remove additional material. A combination of these alternative steps may be used, the important concept of the embodiments is that sufficient thinning is performed to expose the end of trench 27 (now the top end in this illustrative orientation) so that trench 27 extends through the semiconductor wafer 21 between individual integrated circuits formed on the wafer 21 and thereby the process will separate, or "singulate', the integrated circuit dies on wafer 21 into individual integrated circuit die units.

In contrast to known conventional approaches, the dies are separated not by a dicing saw cutting completely through the wafer 21; instead the backgrinding or wafer thinning operation opens the end of the pre-dicing opening 27. Thus the use of the embodiments eliminates the need to mechanically saw completely through the wafer 21 in the scribe areas between the dies. Wafer chipping and edge cracking effects observed in devices in conventional assembly processes using wafer dicing are therefore advantageously reduced or even eliminated.

During the backgrinding operation, the tape 29 provides mechanical support of the wafer 21 and the connectors 23. Additional mechanical support is provided by the protective layer 24. The thinning process involves intense vibration and mechanical stress due to the application of the grinding tool 31 to the wafer surface. Problems observed in prior art arrangements without layer 24 during the backgrinding of a wafer are not seen with the embodiments. So called "dimpling" effects, believed to occur due to uneven wafer thickness that may be caused by the wafer flexing during backgrinding process, are reduced or eliminated by use of the embodiments.

Figure 5:
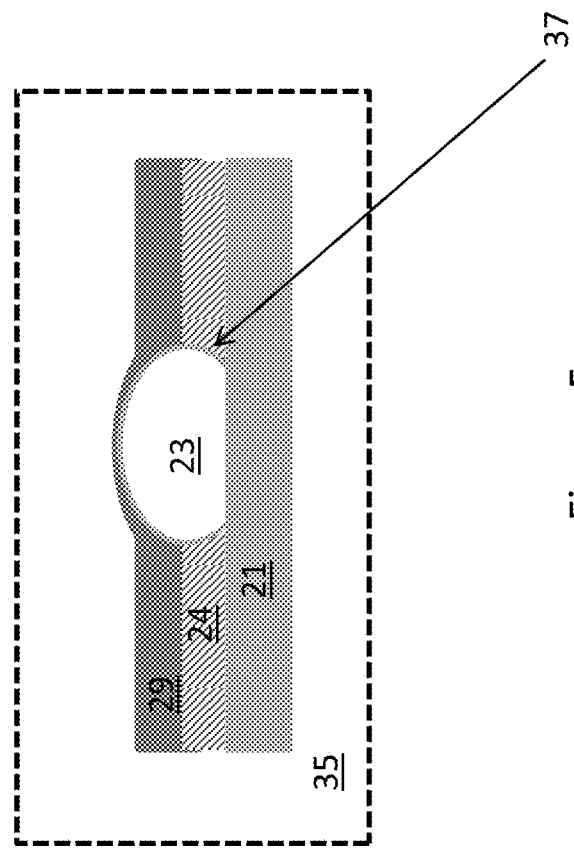
FIG. 5 depicts in a cross sectional view a portion of an embodiment semiconductor wafer.

FIG. 5 depicts in a cross section a detail view of area 35 shown in FIG. 4. As seen in FIG. 5, the tape 29 conformally covers the surface of the connector 23, shown in this non-limiting example as a solder ball. The tape 29 also contacts the surface of the layer 24. However the interface area 37 between the lower portion of the solder ball 23 and the surface of the semiconductor substrate 21 is covered by and surrounded by the protective layer 24. Thus in the embodiments, the tape 29 does not adhere to that lower portion of the solder ball. The tape also does not have to reach all the way down to the surface of the semiconductor substrate 21.

Compared to the known approaches, the embodiments including the protective layer 24 have shown several advantages. The tape 29 is easily removed after the backgrinding operation, so unwanted tape residue is not left on the connectors or the semiconductor wafer 21. Residual backgrinding tape has been observed to proper flux application and cleaning; and can interfere with solder reflow in later assembly steps. Further the protective layer 24 eliminates the interface area 37 from the later flux and flux clean processes, and so no flux residue forms or remains at the interface. This residue, observed in the conventional approach, can cause delamination of the passivation and underfill layers at the die surface, and lead to solder ball cracking and other defects. The embodiments eliminate this interface from the assembly steps such as tape release and flux operations, and thus, eliminate the known problems associated with that interface in the assembly methods.

Figure 6:
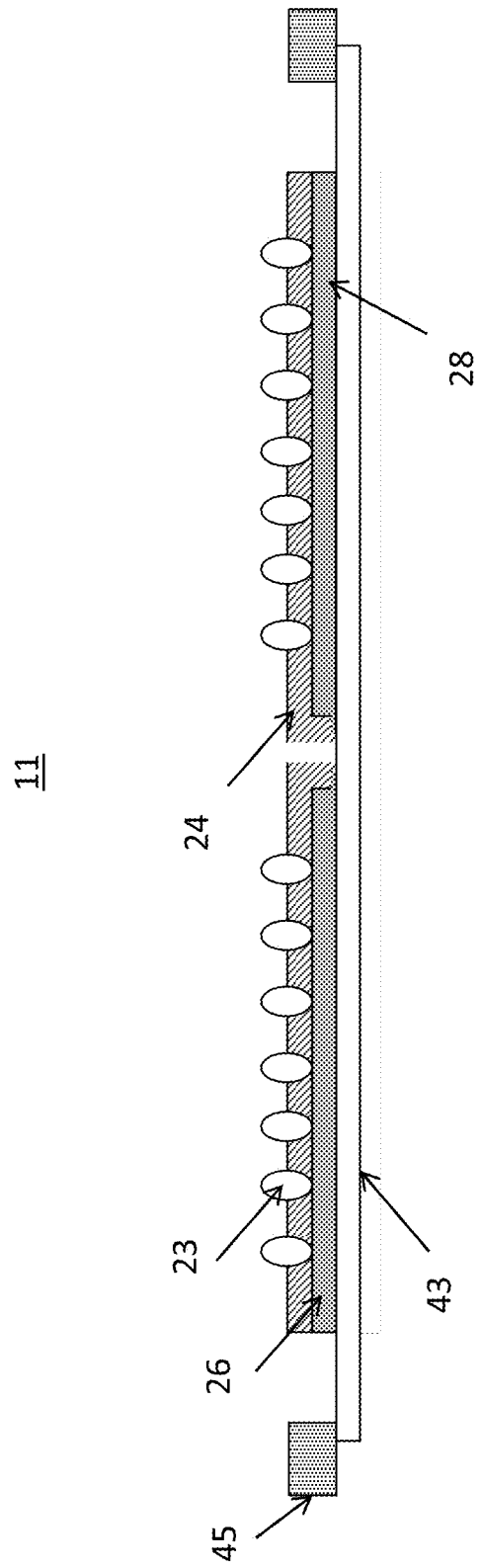
FIG. 6 depicts in another cross sectional view an embodiment device after the completion of certain embodiment processing steps.

FIG. 6 depicts in a cross sectional view the device 11 following additional processing. The backside surface of wafer 21, which following the wafer thinning is now separated into integrated circuits 26 and 28, is mounted to a support wafer mount tape 43 in a frame 45. The backgrinding tape 29 has been removed from the active surface of the wafer 21, and from the outer surface of the terminal connectors 23. The integrated circuit dies 26 and 28 are now ready for additional process steps in a flip chip assembly process.

In an example mounting and assembly process that follows the above embodiments, the individual integrated circuits will be picked and placed and mounted to a substrate by a flip chip, flux, and solder reflow process. After the solder reflow is completed between the flip chips and the substrate, forming an electrical and physical connection between the terminal connectors and the substrate, an additional underfill layer may be formed between the substrate and the active surface of the integrated circuit devices. This underfill layer may be selected for enhanced thermal performance. The use of the protective layer of the embodiments advantageously improves the stability of the connector terminals 23 during these reflow and assembly steps, and eliminates tape residue and flux residue observed in the prior approaches. Flux residue and tape residue can adversely affect or stop the capillary action used to dispense the final underfill layer, causing voids. These voids may lead to delamination or cracking of the finished devices during thermal cycles. Delamination and cracking problems observed with conventionally formed assemblies are advantageously reduced or eliminated by use of the embodiments and by use of the protective layer 24.

Figure 7:
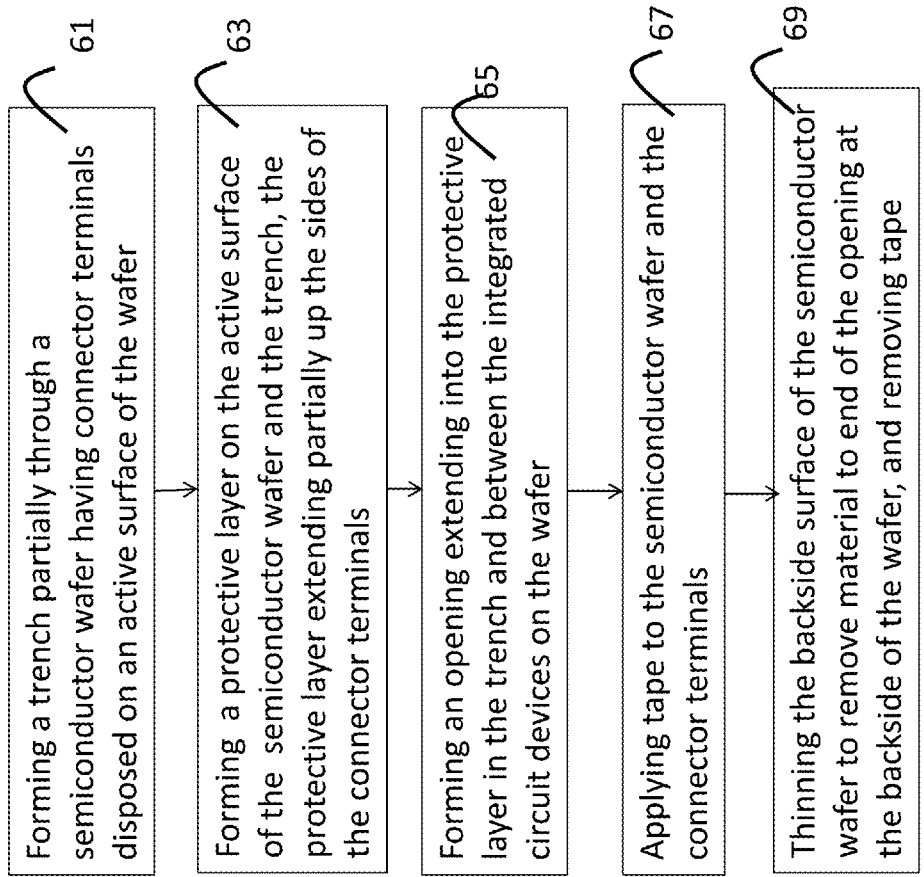
FIG. 7 depicts in a process flow diagram selected steps for an embodiment method.

FIG. 7 depicts in a flow diagram an example method embodiment. At step 61, a trench is formed between integrated circuit dies on a semiconductor wafer having connector terminals extending from the active surface; the trench begins at the active surface and extends into the wafer but not through the wafer.

In step 63, a protective layer is formed over the semiconductor wafer, the connector terminals and extending into the trench, the protective payer extending partially over the sides of the connector terminals and surrounding the connector terminals. The protective layer may be a passivation material such as a polyimide, or it may be an underfill material and may be selected for increased thermal performance. The underfill material may include fillers and additives to control the CTE of the protective layer, for example.

In step 65, a pre-dicing opening is formed in the protective layer between the integrated circuit dies to extend into, but not through, the semiconductor wafer in the trench area formed earlier.

At step 67 such as a backgrinding tape is applied over the semiconductor wafer active surface, covering the connector terminals and the protective layer. The tape may be a backgrinding tape and may be UV or non-UV curable. The tape may be applied conformally to the connector terminals.

In step 67, the wafer is processed in a backside thinning step. The material of the semiconductor wafer is removed from the backside until the pre-dicing opening is exposed at the backside of the wafer, thereby separating the integrated circuit dies into individual units, which are now supported by the tape. The wafer is then mounted to a wafer mounting tape on the backside for support, and the tape is then removed from the protective layer and the connector terminals. The backgrinding tape releases completely from the protective layer, preventing yield problems due to unwanted tape residue observed in known methods. The interface between the connector terminals and the semiconductor wafer is covered by and supported by the protective layer, preventing flux residue and other problems at this interface that are observed in prior known approaches; thereby reducing crack and delamination defects observed with conventional known methods.

In an embodiment, a method is provided forming a trench extending from an active surface of a semiconductor substrate comprising a plurality of integrated circuit dies having connector terminals extending from the active surface, the trench disposed between integrated circuit dies on the semiconductor substrate and extending into, but not through, the semiconductor substrate; forming a protective layer overlying the active surface of the semiconductor substrate and the trench and covering a lower portion of the connector terminals; forming a pre-dicing opening in the protective layer and within the trench, the pre-dicing opening extending into the trench but not through the semiconductor substrate; applying a tape over the active surface of the semiconductor substrate, the protective layer and the connector terminals; and performing a wafer thinning operation on a backside of the semiconductor substrate to remove material until the pre-dicing opening is exposed on the backside of the semiconductor substrate. In a further embodiment, forming the protective layer includes forming a polyimide layer. In another embodiment the above methods are performed wherein the connector terminals comprise copper pillars. In a different embodiment the connector terminals comprise solder bumps. In another embodiment, the above methods are performed and applying the tape comprises applying a backgrinding tape. In still another embodiment applying the tape comprises applying a UV-releasable backgrinding tape. In another embodiment, in the above methods performing the wafer thinning comprises performing a mechanical backgrinding operation.

In another alternative method embodiment, a method is performed including forming trenches between integrated circuits formed on an active surface of a semiconductor wafer, the semiconductor wafer having connector terminals disposed on the active surface and associated with the integrated circuits and the connector terminals having a height extending away from the active surface of the semiconductor wafer; disposing a protective layer of underfill material over the active surface of the semiconductor wafer, the protective layer having a thickness sufficient to cover up to about 50% of the height of the connector terminals; forming a pre-dicing opening in the protective layer in each of the trenches, the pre-dicing opening extending into the trenches from the active surface but not extending through the semiconductor wafer; attaching a backgrinding tape to the active surface of the semiconductor wafer, the backgrinding tape disposed conformally over the connector terminals and the protective layer; and backgrinding the semiconductor wafer on a backside surface of the semiconductor wafer opposite the active surface, removing material from the semiconductor wafer until the pre-dicing opening is exposed at the backside surface.

In another embodiment the above method is performed and further removing the backgrinding tape. In yet another embodiment, in the above methods the underfill material comprises epoxy resin. In still a different embodiment, in the above methods, the underfill material further comprises fillers selected to control a coefficient of thermal expansion of the underfill. In another method, the above methods are performed wherein backgrinding the semiconductor wafer further comprises backgrinding until a remaining thickness of the semiconductor wafer is less than 200 microns. In yet another method, backgrinding the semiconductor wafer further comprises backgrinding until a remaining thickness of the semiconductor wafer is between 50 and 200 microns. In still one another embodiment, the above methods are performed and further include mounting the semiconductor wafer to a wafer mounting tape on the backside surface of the semiconductor wafer; and removing the backgrinding tape from the active surface of the semiconductor wafer.

In an apparatus embodiment, the apparatus includes a semiconductor wafer including a plurality of integrated circuits formed on an active surface of the semiconductor wafer and having areas between the integrated circuits; connector terminals associated with each of the integrated circuits extending from the active surface of the semiconductor wafer; trenches formed in the areas between the integrated circuits on the active surface of the semiconductor wafer, the trenches extending into the semiconductor wafer; a protective layer disposed on the active surface of the semiconductor wafer overlying the active surface and the trenches and partially covering lower portions of the connector terminals. In another embodiment the protective layer comprises polyimide. In yet another embodiment, the protective layer comprises underfill material. In yet another embodiment the protective layer covers approximately 50% of the portion of the connector terminals extending away from the active surface of the semiconductor wafer. In still another embodiment the above apparatus further includes openings in the protective layer and the trench between the integrated circuits. In a further embodiment the openings in the protective layer are exposed at the backside of the semiconductor wafer.

The scope of the present application is not intended to be limited to the particular illustrative embodiments of the structures, methods and steps described in the specification. As one of ordinary skill in the art will readily appreciate from the disclosure of the present disclosure, processes, or steps, presently existing or later to be developed, that perform substantially the same function or achieve substantially the same result as the corresponding embodiments described herein may be utilized according to the present disclosure. Accordingly, the appended claims are intended to include within their scope such processes or steps.

What is claimed is:

1. A method, comprising:
   forming a trench extending from an active surface of a semiconductor substrate comprising a plurality of integrated circuit dies having connector terminals extending from the active surface, the trench disposed between integrated circuit dies on the semiconductor substrate and extending into, but not through, the semiconductor substrate;
   forming a protective layer overlying the active surface of the semiconductor substrate and the trench and covering a lower portion of the connector terminals;
   forming a pre-dicing opening in the protective layer and within the trench, the pre-dicing opening extending into the trench but not through the semiconductor substrate;
   applying a tape over the active surface of the semiconductor substrate, the protective layer and the connector terminals; and
   removing a portion of a backside of the semiconductor substrate until the pre-dicing opening is exposed on the backside of the semiconductor substrate.

2. The method of claim 1, wherein forming the protective layer comprises forming a polyimide layer.

3. The method of claim 1, wherein the connector terminals comprise copper pillars.

4. The method of claim 1, wherein the connector terminals comprise solder bumps.

5. The method of claim 1, wherein applying the tape comprises applying a backgrinding tape.

6. The method of claim 1, wherein applying the tape comprises applying a UV-releasable backgrinding tape.

7. The method of claim 1, wherein the removing comprises performing a mechanical grinding operation.

8. A method comprising:
   forming trenches between integrated circuits formed on an active surface of a semiconductor wafer, the semiconductor wafer having connector terminals disposed on the active surface and associated with the integrated circuits and the connector terminals having a height extending away from the active surface of the semiconductor wafer;
   disposing a protective layer of underfill material over the active surface of the semiconductor wafer, the protective layer having a thickness sufficient to cover about 50% of the height of the connector terminals;
   forming a pre-dicing opening in the protective layer in each of the trenches, the pre-dicing opening extending into the trenches from the active surface but not extending through the semiconductor wafer;
   attaching a backgrinding tape to the active surface of the semiconductor wafer, the backgrinding tape disposed conformally over the connector terminals and the protective layer; and
   backgrinding the semiconductor wafer on a backside surface of the semiconductor wafer opposite the active surface, removing material from the semiconductor wafer until the pre-dicing opening is exposed at the backside surface.

9. The method of claim 8 and further comprising removing the backgrinding tape.

10. The method of claim 8 wherein the underfill material comprises epoxy resin.

11. The method of claim 8 wherein the underfill material further comprises fillers selected to control a coefficient of thermal expansion of the underfill.

12. The method of claim 8 wherein backgrinding the semiconductor wafer further comprises backgrinding until a remaining thickness of the semiconductor wafer is less than 200 microns.

13. The method of claim 8 wherein backgrinding the semiconductor wafer further comprises backgrinding until a remaining thickness of the semiconductor wafer is between 50 and 200 microns.

14. The method of claim 8 and further comprising mounting the semiconductor wafer to a wafer mounting tape on the backside surface of the semiconductor wafer; and
   removing the backgrinding tape from the active surface of the semiconductor wafer.

* * * * *